United States Patent
Ely et al.

(10) Patent No.: US 11,904,312 B2
(45) Date of Patent: Feb. 20, 2024

(54) MICROFLUIDIC DEVICES WITH LID FOR LOADING FLUID

(71) Applicant: Hewlett-Packard Development Company, L.P., Spring, TX (US)

(72) Inventors: Hilary Ely, Corvallis, OR (US); Adam Higgins, Corvallis, OR (US); Rachel M. White, Corvallis, OR (US); Erik D. Torniainen, Corvallis, OR (US); Tod Woodford, Corvallis, OR (US); Michael W. Cumbie, Corvallis, OR (US); Chien-Hua Chen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 556 days.

(21) Appl. No.: 16/643,264

(22) PCT Filed: Nov. 22, 2017

(86) PCT No.: PCT/US2017/062925
§ 371 (c)(1),
(2) Date: Feb. 28, 2020

(87) PCT Pub. No.: WO2019/103729
PCT Pub. Date: May 31, 2019

(65) Prior Publication Data
US 2020/0206734 A1 Jul. 2, 2020

(51) Int. Cl.
*B01L 3/00* (2006.01)
*B81B 1/00* (2006.01)

(52) U.S. Cl.
CPC ..... *B01L 3/502715* (2013.01); *B01L 3/50273* (2013.01); *B01L 3/502723* (2013.01);
(Continued)

(58) Field of Classification Search
CPC .. B01L 3/502715; B01L 3/5027; B01L 3/502; B01L 3/50; B01L 3/502723;
(Continued)

(56) References Cited

U.S. PATENT DOCUMENTS

| | | | |
|---|---|---|---|
| 6,605,454 B2 | 8/2003 | Barenburg et al. | |
| 6,875,619 B2 * | 4/2005 | Blackburn | B01J 19/0093 435/287.1 |

(Continued)

FOREIGN PATENT DOCUMENTS

| | | |
|---|---|---|
| EP | 1065378 | 1/2001 |
| WO | 2010041174 | 4/2010 |

OTHER PUBLICATIONS

Li et al., USB-driven microfluidic chips on printed circuit boards, Lab on a Chip, Royal Society of Chemistry, vol. 14, 2014, pp. 860-864.
(Continued)

*Primary Examiner* — Christine T Mui
(74) *Attorney, Agent, or Firm* — Foley & Lardner LLP (57) ABSTRACT

The present disclosure is drawn to microfluidic devices. A microfluidic device can include a substrate, a lid mounted to the substrate, and a microchip mounted to the substrate. The lid mounted to the substrate can form a discrete microfluidic chamber between structures including an interior surface of the lid and a portion of the substrate. The lid can include an
(Continued)

inlet and a vent positioned relative to one another to facilitate loading of fluid to the discrete microfluidic chamber via capillary action. A portion of the microchip can be positioned within the discrete microfluidic chamber.

13 Claims, 3 Drawing Sheets

(52) U.S. Cl.
CPC ... *B01L 2300/041* (2013.01); *B01L 2300/048* (2013.01); *B01L 2300/06* (2013.01); *B01L 2300/0627* (2013.01); *B01L 2300/0654* (2013.01); *B01L 2300/0681* (2013.01); *B01L 2300/0819* (2013.01); *B01L 2300/12* (2013.01); *B01L 2300/18* (2013.01); *B01L 2400/0406* (2013.01); *B81B 1/00* (2013.01)

(58) Field of Classification Search
CPC .......... B01L 3/50273; B01L 2300/041; B01L 2300/048; B01L 2300/06; B01L 2300/0627; B01L 2300/0654; B01L 2300/0681; B01L 2300/0819; B01L 2300/12; B01L 2300/18; B01L 2400/0406; B81B 1/00

USPC ......................................... 422/502, 501, 500
See application file for complete search history.

(56) References Cited

U.S. PATENT DOCUMENTS

| | | | |
|---|---|---|---|
| 7,258,161 | B2 | 8/2007 | Cosley et al. |
| 8,574,965 | B2 | 11/2013 | Refai-Ahmed et al. |
| 9,478,504 | B1 | 10/2016 | Shen et al. |
| 9,670,445 | B1 | 6/2017 | Kuo et al. |
| 2003/0064507 | A1 | 4/2003 | Gallagher et al. |
| 2010/0159582 | A1 | 6/2010 | Ismail et al. |
| 2013/0105317 | A1 | 5/2013 | Weber et al. |
| 2016/0199835 | A1 | 7/2016 | Tachibana et al. |
| 2017/0326546 | A1 | 11/2017 | Peumans et al. |

OTHER PUBLICATIONS

Bruijns et al., Microfluidic Devices for Forensic DNA Analysis: A Review, biosensors (/journal/biosensors), vol. 6, Issue 3, Aug. 5, 2016, 48 pages.
International Search Report dated Aug. 2, 2018 for PCT/US2017/062925, Applicant Hewlett-Packard Development Company, L.P.
Temiz et al., Lab-on-a-chip devices: How to close and plug the lab? Microelectronic Engineering 132, 2015, pp. 156-175.

* cited by examiner

MICROFLUIDIC DEVICES WITH LID FOR LOADING FLUID

BACKGROUND

Microfluidics involves the flow of relatively small volumes of a fluid within micrometer-sized channels or smaller. Microfluidic systems have many diverse applications in areas such as biological assays, drug screening, fuel cells, etc. However, the microfluidic behavior of a fluid can differ from the macrofluidic behavior of a fluid. For example, fluid properties such as surface tension and fluidic resistance can play a more dominant role in the microfluidic behavior of fluids than they do on the macroscopic level. Thus, the ability to effectively manipulate fluids in a microfluidic system can expand the number of areas and ways in which these systems can be used.

BRIEF DESCRIPTION OF THE DRAWINGS

Additional features and advantages of the disclosure will be apparent from the detailed description which follows, taken in conjunction with the accompanying drawings, which together illustrate, by way of example, features of the present technology.

Reference will now be made to several examples that are illustrated herein, and specific language will be used herein to describe the same. It will nevertheless be understood that no limitation of the scope of the disclosure is thereby intended.

DETAILED DESCRIPTION

Microfluidic devices can be used for a variety of applications, including biotechnology, drug screening, clinical diagnostic testing, etc. However, as is known to one skilled in the art, establishing and maintaining a known and controlled volume of fluid is fundamental to microfluidic-based tests. For example, the volume scale in microfluidic testing can magnify the impact of evaporation, buoyant convective mixing, surface adhesion, diffusion, etc. on test performance as compared to tests employing larger fluid volumes. Accordingly, the present disclosure describes a microfluidic device having a lid structure for loading fluid, and in certain examples, to help establish and maintain a controlled volume of fluid for microfluidic-based testing.

The microfluidic device can include a substrate, a lid mounted to the substrate, and a microchip mounted to the substrate. The lid mounted to the substrate can form a discrete microfluidic chamber between structures including an interior surface of the lid and a portion of the substrate. The lid can include an inlet and a vent positioned relative to one another to facilitate loading of fluid to the discrete microfluidic chamber via capillary action. A portion of the microchip can be positioned within the discrete microfluidic chamber.

In another example, a microfluidic device can include a substrate, a lid mounted to the substrate, and an elongated microchip mounted to the substrate. The lid mounted to the substrate can form a discrete microfluidic chamber between structures including an interior surface of the lid and a portion of the substrate. The lid can include an inlet and a vent positioned relative to one another to facilitate loading of fluid to the discrete microfluidic chamber via capillary action. A portion of the elongated microchip can be positioned within the discrete microfluidic chamber. Furthermore, the elongated microchip can have a width to length aspect ratio from 1:10 to 1:150.

In another example, the microfluidic device can include a substrate, a lid mounted to the substrate, and a microchip mounted to the substrate. The lid mounted to the substrate can form a discrete microfluidic chamber between structures including an interior surface of the lid and a portion of the substrate. The lid can include an inlet and a vent positioned relative to one another to facilitate loading of fluid to the discrete microfluidic chamber via capillary action.

The discrete microfluidic chamber can have a volume of from 1 nl to 100 µl, for example. A portion of the microchip can be positioned within the discrete microfluidic chamber.

In these various microfluidic examples, the substrate cab include a material selected from a metal, glass, silicon, silicon dioxide, a ceramic material, a polymer material, or a combination thereof. The lid, on the other hand, can include a material selected from glass, quartz, polymer, amorphous polymer, or a combination thereof.

In another example, the lid can form multiple discrete microfluidic chambers between structures including portions of the interior surface of the lid and corresponding portions of the substrate. In another example, the microfluidic device can include a second lid that can form a second discrete microfluidic chamber between structures including an interior surface of the second lid and a second portion of the substrate. The second lid can include a second inlet and a second vent positioned relative to one another to facilitate loading of fluid to the second discrete microfluidic chamber via capillary action. In this example, a second portion of the microchip can be positioned within the second discrete microfluidic chamber.

In some examples, the discrete microfluidic chamber can have a volume of from 1 nl to 100 µl. In other examples, the lid can have a height of from 0.2 mm to 5 mm, a width of from 0.4 mm to 50 mm, a length of from 0.1 mm to 60 mm, and a thickness of from 0.1 mm to 5 mm. In still other examples, the lid can further include an exterior surface modification selected from a Fresnel lens, a crenulated surface, a non-uniform thickness, a thin film optical filter, or a combination thereof. In some additional examples, the lid can further include an interior surface modification to improve surface wetting, e.g., surface coating, surface treatment, or a combinations thereof. In still other examples, the microchip can include an exterior modification.

Figure 1A:
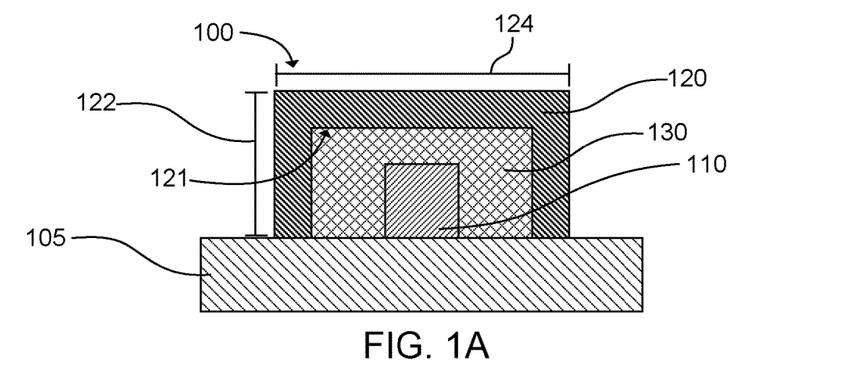
FIG. 1A is a side cross-sectional view of an example microfluidic device in accordance with the present disclosure.
Figure 1B:
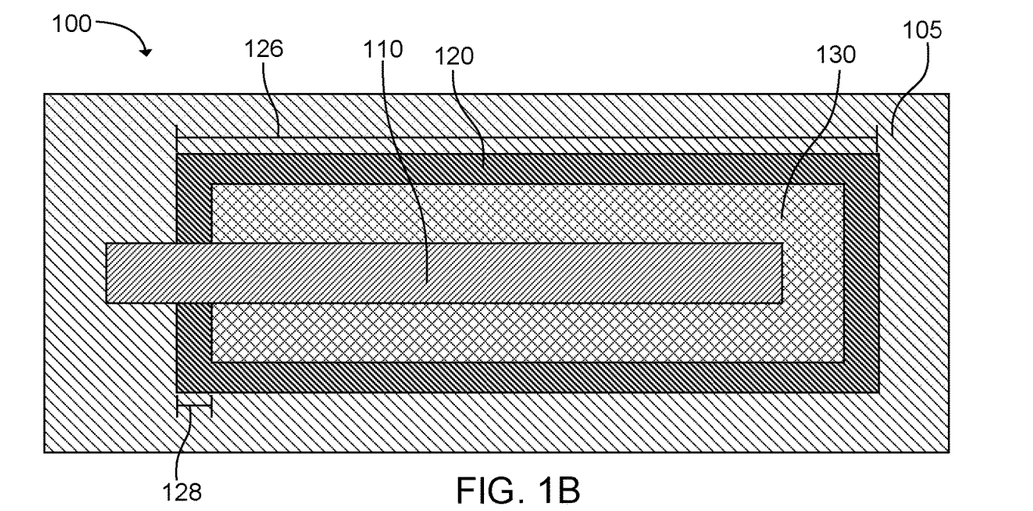
FIG. 1B is a top cross-sectional view of an example microfluidic device in accordance with the present disclosure.
Figure 1C:
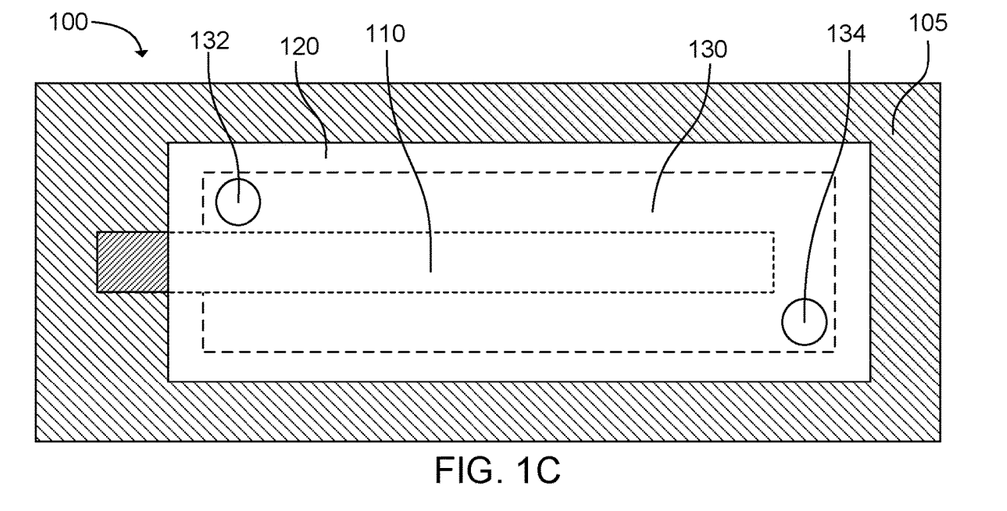
FIG. 1C is a top plan view of an example microfluidic device in accordance with the present disclosure.

Reference will now be made to FIGS. 1A-1C to help describe some of the general features of the microfluidic device. It is noted that the microfluidic devices depicted in the present figures are not drawn to scale and are not intended to be interpreted as such. The representations of the microfluidic devices in the figures are merely intended to facilitate the description and presentation of the microfluidic devices disclosed herein. It is further noted that when discussing microfluidic devices, chambers, or the like, this is also intended to encompass mesofluidic devices, chambers, or the like. Thus, in some examples, the microfluidic chambers described herein can include sub-millimeter dimensions. In other examples, the microfluidic chambers can include from millimeter to centimeter dimensions. Thus, for simplicity, both microfluidics and mesofluidics are referred to herein as microfluidics.

With this in mind, FIGS. 1A-1C depict an example of a microfluidic device 100 having a substrate 105 with a microchip 110 mounted thereto. A lid 120 can be mounted to the substrate, which can form a discrete microfluidic chamber 130 between structures including an interior surface 121 of the lid a portion of the substrate. The lid can include an inlet 132 and a vent 134 positioned relative to one another to facilitate loading of a fluid to the discrete microfluidic chamber via capillary action.

In further detail, a variety of suitable substrates can be used. Typically, any substrate to which the microchip and the lid can be mounted, and that is suitable for a particular application, can be used. In some specific examples, the substrate can include or be made of a material such as a metal, glass, silicon, silicon dioxide, a ceramic material (e.g., alumina, aluminum borosilicate, etc.), a polymer material (e.g., polyethylene, polypropylene, polycarbonate, poly (methyl methacrylate), epoxy molding compound, polyamide, liquid crystal polymer (LCP), polyphenylene sulfide, etc.), the like, or a combination thereof. Additionally, the substrate can typically have any suitable dimensions for a given application so long as the microchip and lid structure can be effectively mounted thereto. Thus, in some examples, the substrate and the lid can be architecturally compatible to form a complete seal at their interface.

It is noted that in some examples, the microchip can be an elongated microchip. By "elongated microchip," it is to be understood that the microchip generally has an aspect ratio of from 1:10 to 1:150 width to length.

However, in some examples the elongated microchip can have an aspect ratio of from 1:1.1 to 1:50 width to length. In yet other examples, the elongated microchip can have an aspect ratio of from 1:2 to 1:25 width to length. However, in other examples, the microchip is not an elongated microchip such that the microchip can be substantially square, circular, or otherwise fall outside of the aspect ratio described above. The microchip can be made of a variety of materials. In some examples, the microchip includes or is made of silicon. In other examples, the microchip can include or be made of glass, quartz, or ceramic. In some examples, the microchip can include a wire, a trace, a network of wires, a network of traces, an electrode or the like embedded in or proud of the substrate.

The microchip can include a variety of functional components, such as heaters, sensors, electromagnetic radiation sources, fluid actuators, mixers, bubblers, fluid pumps, the like, or combinations thereof, which can vary depending on the intended application of the microfluidic device.

As illustrated in FIG. 1A, in some examples, the microchip 110 can be substantially disposed above the substrate 105. However, in some examples, the microchip, or a portion thereof, can be embedded within the substrate such that a lesser portion of the microchip extends above the substrate. In some further examples, the microchip does not extend above the substrate, but a portion (e.g., a single surface or portion of a surface) of the microchip is exposed to interact with a fluid introduced into the discrete microfluidic chamber 130.

Additionally, in some examples, as illustrated in FIGS. 1B and 1C, a portion of the microchip 110 can be positioned within the discrete microfluidic chamber 130 (e.g., an internal portion) and a portion or portions of the microchip can be positioned outside of the discrete microfluidic chamber (e.g., an external portion). Thus, in some examples, not all exposed surfaces (e.g., surfaces, or portions of surfaces, not directly mounted to the substrate 105) are disposed within the discrete microfluidic chamber. However, in some examples, each of the exposed surfaces of the microchip can be disposed within the discrete microfluidic chamber (See FIG. 2, for example). Generally, the microchip can be oriented in any suitable way so that the microchip, or a portion thereof, can be positioned within the discrete microfluidic chamber. This can allow a fluid introduced into the discrete microfluidic chamber to interface with, approximate, or otherwise interact with the microchip.

As described above, the discrete microfluidic chamber 130 can be formed between structures including an interior surface 121 of the lid 120 and portion of the substrate 105. The lid can have a variety of dimensions and geometries depending on the particular application and desired configuration of the discrete microfluidic chamber. Generally, the lid can be shaped to house a portion of the microchip 110 that includes an active component for monitoring or manipulating a test fluid. The lid can generally form a fluid seal against the substrate 105 so that fluid can only enter and exit the discrete microfluidic chamber through designated inlets and outlets, such as inlet 132 and outlet/vent 134. In some examples, where a portion or portions of the microchip extend out of the discrete microfluidic chamber, the lid can also form a fluid seal against a segment or segments of the microchip.

The positioning of the inlet 132 and outlet/vent 134 is not particularly limited. Generally, the inlet and vent are positioned relative to one another to facilitate introduction of a fluid into the discrete microfluidic chamber 130 via capillary action. Further, in some examples the inlet and vent can be positioned relative to one another to approximate a fluid to or interface a fluid with the microchip 110 to facilitate fluid monitoring and/or manipulation via the microchip.

As described above, the lid 120 can have a variety of geometries. As illustrated in FIGS. 1A-1C, the lid can have a rectangular shape. However, this is not required. Other geometries can also be employed as desired for particular applications, such as elliptical, circular, arcuate, polygonal, trapezoidal, and other desirable geometries.

Further, the lid 120 can have any suitable outer dimensions to house the microchip 110 or a portion thereof. In some specific examples, the lid can have a height 122 of from about 0.2 mm to about 3 mm. In other examples, the lid can have a height of from about 0.5 mm to about 2 mm. In still other examples, the lid can have a height of from about 1 mm to about 5 mm. In some specific examples, the lid can have a width 124 of from about 0.4 mm to about 10 mm. In other examples, the lid can have a width of from about 1 mm to about 4 mm. In still other examples, the lid can have a width of from about 10 mm to about 50 mm. In some specific examples, the lid can have a length 126 of from about 0.1 mm to about 60 mm. In other examples, the lid can have a length of from about 1 mm to about 20 mm. In still other examples, the lid can have a length of from about 10 mm to about 50 mm.

The thickness 128 of the lid 120 can vary depending on the particular application of the microfluidic device 100. Generally, the lid can have a thickness of from about 0.1 mm to about 5 mm. However, in some cases, the lid can be designed to be relatively thin. In some examples, a thinner lid can provide increased optical clarity or translucence, increased heat dissipation from the microfluidic chamber 130, etc. as compared to a thicker lid. Where a thinner lid is desirable, the lid can generally have a thickness of from about 0.1 mm to about 0.5 mm. In other examples, it can be desirable to have a thicker lid. In some cases, a thicker lid can provide decreased optical clarity or translucence, increased thermal insulation, etc. as compared to a thinner lid. Where a thicker lid is desired, the lid can generally have a thickness of from about 0.5 mm to about 5 mm. Further still, in some examples, it can be desirable to have a lid with a non-uniform thickness along a height, width, or length of the lid, or combinations thereof. By "non-uniform thickness," it is to be understood that the lid as a predetermined non-uniformity of thickness that is not merely an artifact of the lid manufacturing process. Thus, "non-uniform thickness" can refer to predetermined differences in lid thickness to achieve a desired structural, mechanical, functional, or other suitable property of the lid.

The lid can be formed of a variety of different materials. Non-limiting examples can include glass, quartz, a metal, a polymer, an amorphous polymer, or other suitable materials. Non-limiting examples of polymers can include polydimethylsiloxane (PDMS), cyclic olefin polymer (COP), cyclic olefin copolymer (COC), polyethylene terephthalate (PET), the like, or a combination thereof. In some examples, the lid can include or be made of a transparent or translucent material such as glass, quartz, polycarbonate, trivex, COC, the like, or a combination thereof. In some examples, the lid can include or be made of a non-translucent material, such as silicon, a metal, the like, or a combination thereof. In some examples, the material used to manufacture the lid can be doped with a dopant to enhance thermal performance, optical performance, chemical performance, the like, or a combination thereof. Non-limiting examples of dopants can include erbium, $AlO_x$, $TaO_x$, or the like.

The lid can be formed in a variety of ways. Non-limiting examples can include injection molding, cast molding, compression molding, etching, cutting, melting, drilling, routing, the like, or a combination thereof.

Figure 2:
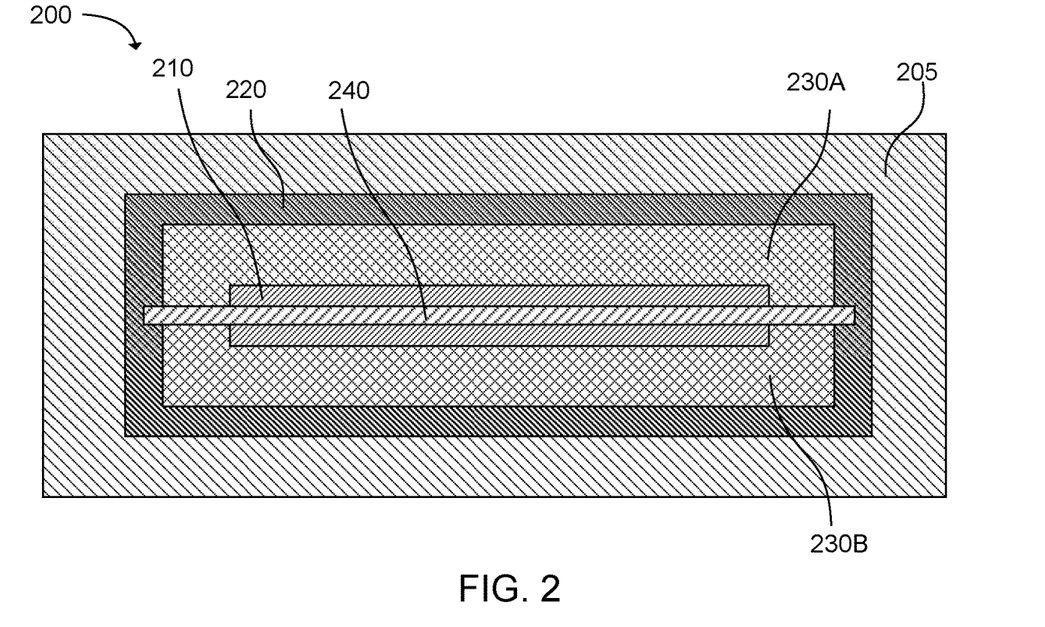
FIG. 2 is a top cross-sectional view of an example microfluidic device in accordance with the present disclosure.

The lid can be used to form a single discrete microfluidic chamber or any of a number of discrete microfluidic chambers. For example, FIG. 2 illustrates a microfluidic device 200 having a substrate 205 with a microchip mounted 210 thereto. Additionally, a lid 220 is mounted to the substrate forming a discrete microfluidic chamber between structures including an interior surface of the lid and a portion of the substrate. In this particular example, the entire exposed surface of the microchip is positioned within the discrete microfluidic chamber. Additionally, a barrier 240 has been positioned within the microfluidic chamber to subdivide the discrete microfluidic chamber into multiple (or a plurality of) discrete microfluidic chambers 230A, 230B. The fluid barrier can be formed of any suitable material to impede fluid flow between discrete microfluidic chambers 230A, 230B. In some specific examples, the barrier can be formed from an adhesive, such as thin film adhesives, spray adhesives, adhesives that can be cured in situ, the like, or a combination thereof. Additional barriers can likewise be used to further subdivide the discrete microfluidic chamber into additional sub-chambers. It is noted that where this is the case, a portion of the microchip can be positioned within each of the sub-chambers. Additionally, an inlet and vent can be associated with individual discrete microfluidic chambers to facilitate loading of the chambers via capillary action.

Figure 3:
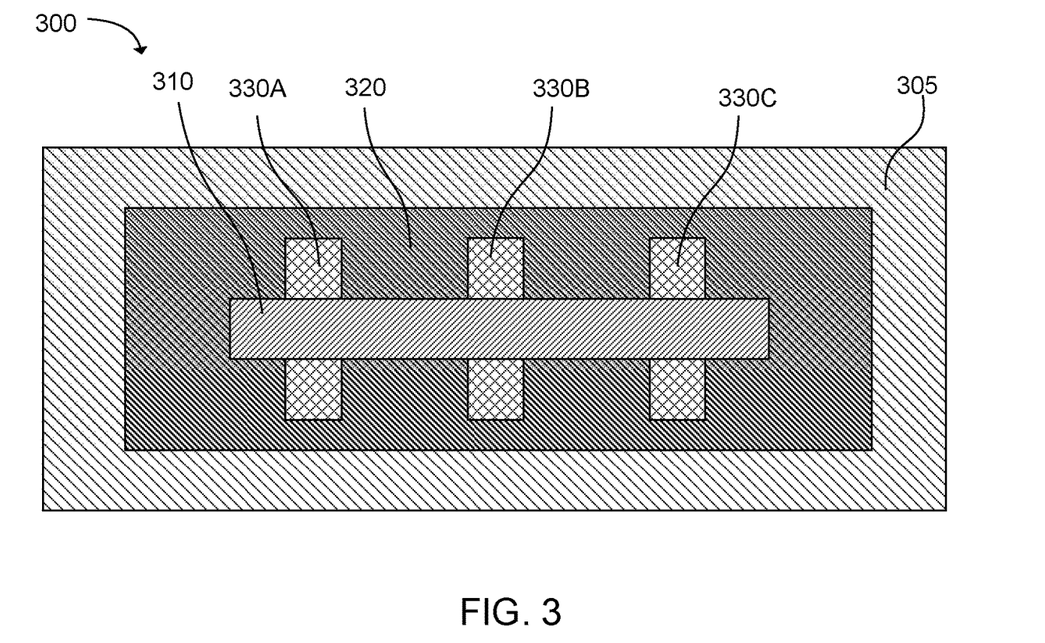
FIG. 3 is a top cross-sectional view of an example microfluidic device in accordance with the present disclosure.

In yet another example, FIG. 3 illustrates a microfluidic device 300 having a substrate 305 with a microchip 310 mounted thereto. A lid 320 is also mounted to the substrate. In this particular example, the lid has been shaped to form multiple discrete microfluidic chambers 330A, 330B, 330C between structures including respective portions of the interior surface of the lid and corresponding portions of the substrate. Thus, multiple discrete microfluidic chambers can be formed without the use of additional barriers as is employed in the example illustrated in FIG. 2. However, additional barriers can still be used as desired where the lid already forms multiple discrete microfluidic chambers. It is also noted that, in this particular example, the discrete microfluidic chambers are oriented in a direction transverse to the microchip. However, this is not necessary. The discrete microfluidic chambers can be oriented in any suitable orientation relative to the microchip.

It is also noted that, while not illustrated in FIGS. 2 and 3, the same number and orientation of discrete microfluidic chambers can be formed by mounting multiple lids to the substrate. Individually, any one of the multiple lids can form a single discrete microfluidic chamber or multiple (a plurality of) microfluidic chambers, such as in a manner already described (e.g., via fluid barriers, lids with pre-formed sub-chambers, etc.).

Depending on the number of discrete microfluidic chambers included in the device and the particular application of the device, the internal volume of the discrete microfluidic chamber can vary somewhat. For example, where a single microfluidic chamber is employed, the discrete microfluidic chamber can typically have a volume of from about 1 nl to about 100 μl. In other examples the discrete microfluidic chamber can have a volume of from 100 nl to 1 μl. In yet other examples, the discrete microfluidic chamber can have a volume of from about 1 μl to about 10 μl. In still other examples, the discrete microfluidic chamber can have a volume of from about 500 nl to about 6 μl. Where multiple discrete microfluidic chambers are employed, the combined volume of the discrete microfluidic chambers can typically fall within the ranges recited above. Individual chamber volumes can be calculated based on the proportion of the combined volume provided by any given chamber. However, for some applications, the internal volume of the discrete microfluidic chamber(s) may vary somewhat outside of the ranges disclosed herein.

Figure 4:
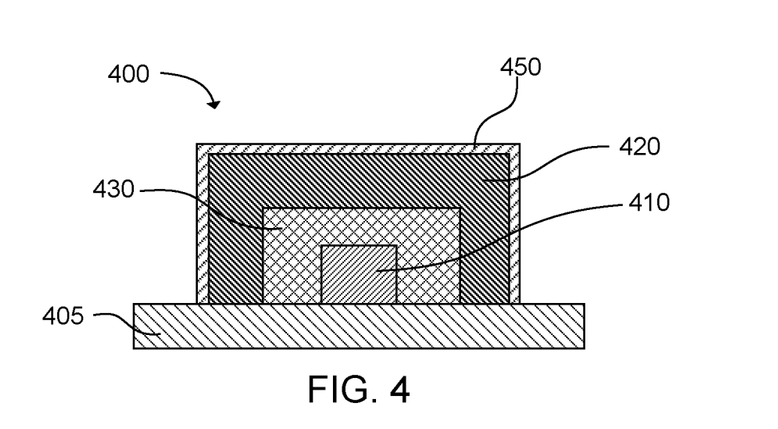
FIG. 4 is a side cross-sectional view of an example microfluidic device in accordance with the present disclosure.

It is further noted that, in some cases, various surface modifications can be made to the lid structure. For example, in some cases, the lid can include an exterior surface modification. In some examples, the exterior surface modification can include a thin film coating or other exterior surface treatment. For example, as illustrated in FIG. 4, a microfluidic device 400 can include a substrate 405, a microchip 410 mounted to the substrate, and a lid 420 mounted to the substrate as described elsewhere herein to form a discrete microfluidic chamber 430. In this particular example, the lid can have a modified exterior surface modification in the form of a thin film 450 applied to the exterior surface of the lid. In some examples, the thin film or treatment can be applied to the exterior surface of the lid for improved optical performance. For example, a variety of thin film optical filters can be deposited on an exterior surface of the lid, such as an anti-reflective film, an absorptive film, a band-pass filter, a optically polarizing film, the like, or a combination thereof. As will be recognized by one skilled in the art, a variety of other similar optical properties can be imparted to the lid via deposition of a thin film to an exterior surface thereof.

Figure 5:
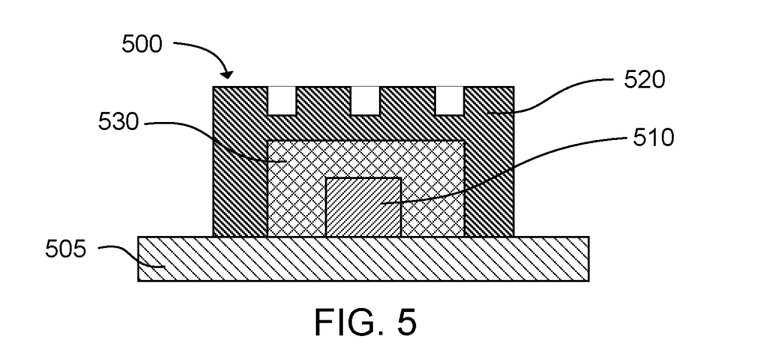
FIG. 5 is a side cross-sectional view of an example microfluidic device in accordance with the present disclosure.

In some examples, the exterior surface modification can facilitate heat dissipation from the discrete microfluidic chamber. For example, as illustrated in FIG. 5, a microfluidic device 500 can include a substrate 505, a microchip 510 mounted to the substrate, and a lid 520 mounted to the substrate as described elsewhere herein to form a discrete microfluidic chamber 530. In this particular example, the lid can have a modified exterior surface to form a crenulated surface. In some examples, a crenulated surface can facilitate heat dissipation from the discrete microfluidic chamber. FIG. 5 illustrates only one example of a surface modification that can facilitate heat dissipation from the discrete microfluidic chamber. Numerous other exterior surface modifications can likewise be made to facilitate such heat dissipation, as will be recognized by one skilled in the art.

Figure 6:
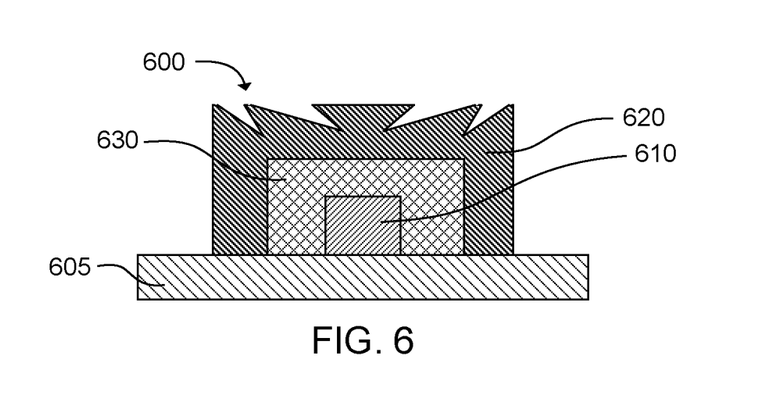
FIG. 6 is a side cross-sectional view of an example microfluidic device in accordance with the present disclosure.

In some examples, an exterior surface modification can be made to the lid to increase optical performance of the lid. For example, as illustrated in FIG. 6, a microfluidic device 600 can include a substrate 605, a microchip 610 mounted to the substrate, and a lid 620 mounted to the substrate as described elsewhere herein to form a discrete microfluidic chamber 630. In this particular example, the exterior surface of the lid can be modified to include or form a Fresnel lens. In some examples, a Fresnel lens can enhance the intensity of fluorescence, colorimetric, bioluminescence, chemiluminescence, or other similar signals generated within the microfluidic chamber. In some examples, the exterior surface of the lid can be modified to include or form a light pipe to transmit light from one point on the lid to another.

In some additional examples, the lid can include surface modification to improve wetting, such as by modifying the surface energy of the interior of the lid. For example, an interior surface modification can be made to the interior or lid to minimize or prevent interactions between a test fluid and the interior surface of the lid. Such modifications can include the application of a surface coating (e.g., "non-stick" coatings) or treatment (e.g., silane treatments), for example. Surface modification, such as surface energy modification, can be performed by a variety of suitable methods, such as via UV treatment, plasma treatment, ozone treatment, the like, or a combination thereof, for example. Modification by coating or treatment can also be performed prior to mounting the lid to the substrate, after mounting the lid to the substrate, or a combination thereof.

To manufacture the microfluidic device, a microchip can be mounted a substrate. A lid can also be mounted to the substrate to form a discrete microfluidic chamber between structures including an interior surface of the lid and a portion of the substrate. The lid can include an inlet and a vent positioned relative to one another to facilitate loading of a fluid to the discrete microfluidic chamber via capillary action. The discrete microfluidic chamber can include a portion of the microchip (e.g., a portion of the microchip can be positioned within the discrete microfluidic chamber).

The microchip can be mounted to the substrate in any suitable way, such as using wire bonding, die bonding, flip chip mounting, surface mount interconnects, the like, or a combination thereof.

The lid can also be mounted to the substrate in a variety of ways. Generally, any mounting process that can form a fluid seal between the lid and the substrate can be used. This can prepare a discrete microfluidic chamber that only permits a fluid to enter and exit the chamber at designated inlet and outlet sites. In some specific examples, the mounting the lid to the substrate can be performed by adhering the lid to the substrate via an adhesive. In some examples, the adhesive can be a curable adhesive. As such, in some examples, mounting can include curing the adhesive via electromagnetic radiation, heat, chemical agents, the like, or a combination thereof. Non-limiting examples of suitable adhesives can include epoxy adhesives, acrylic adhesives, the like, or a combination thereof. In other examples, the lid can be mounted to the substrate via laser welding, ultrasonic welding, thermosonic welding, the like, or a combination thereof to mount the lid directly to the substrate.

As a single example, a microfluidic device can be prepared by mounting a microchip, such as a silicon microchip, to a substrate. A lid structure was then mounted to the substrate to cover a portion of, or in some examples a majority of, the silicon microchip to form a discrete microfluidic channel about the silicon microchip. An inlet and vent can be formed in the opposite ends of the lid structure to facilitate loading of the discrete microfluidic channel via capillary action. The lid can be made of glass, or any of the other materials described herein, for example. The outer dimensions of the lid can be, in one example, as follows: ~2 mm width, ~0.7 mm height, and ~20 mm length. The inner dimensions of the lid can be, in one example, as follows: ~0.6 mm width, ~0.4 mm height, and ~20 mm length. The lid can be formed of a single chamber having an internal volume of about 4 µl. Other dimensions, materials, etc., can be used, but this provides one specific example of a microfluidic device that can be prepared in accordance with the present disclosure.

The microfluidic devices described herein can be used to evaluate a test fluid, for example, such as by introducing a test fluid into a discrete microfluidic chamber of a microfluidic device described herein. The microfluidic device can include a substrate, a microchip mounted to the substrate, and a lid mounted to the substrate. The lid can form the discrete microfluidic chamber between structures including an interior surface of the lid and a portion of the substrate. The lid can also include an inlet and a vent positioned relative to one another to facilitate loading of a fluid to the discrete microfluidic chamber via capillary action. The discrete microfluidic chamber can include a portion of the microchip (e.g., a portion of the microchip can be positioned within the discrete microfluidic chamber).

Introducing the test fluid into the discrete microfluidic chamber can be performed in a number of ways. For example, in some cases, introducing the test fluid can include introducing an aliquot of a plurality of test samples to separate microfluidic chambers formed between structures including respective portions of the interior surface of the lid and corresponding portions of the substrate. The separate microfluidic chambers can include different portions of the microchip, e.g., different portions of the microchip can be positioned within any of the separate microfluidic chambers. Alternatively, multiple of aliquots of the sample test fluid can be introduced into any of the separate discrete microfluidic chambers. The separate microfluidic chambers can be formed from a common lid or by separate lids, as described elsewhere herein. Of course, introducing the test fluid can also include introducing an aliquot of the test fluid into a single discrete microfluidic chamber, rather than to a plurality of separate discrete microfluidic chambers. Additionally, depending on the particular application, the test fluid can be a liquid, a gas, or a combination thereof.

The test fluid can be evaluated in a number of ways. For example, in some cases, evaluating can include optically evaluating, thermally evaluating, electrochemically evaluating, the like, or a combination thereof. The sensors employed in evaluating the test fluid can be external sensors or internal sensors (e.g., incorporated with the microchip). In some examples, a combination of external sensors and internal sensors can be employed to evaluate the sample. A wide variety of sensors can be used, as will be recognized by one skilled in the art, such as photodiodes, thermocouples, electrodes, the like, or combinations thereof.

It is noted that, as used in this specification and the appended claims, the singular forms "a," "an," and "the" include plural referents unless the content clearly dictates otherwise.

As used herein, the term "about" is used to provide flexibility to a numerical range endpoint by providing that a given value may be "a little above" or "a little below" the endpoint. The degree of flexibility of this term can be dictated by the particular variable and can be determined based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a weight ratio range of about 1 wt % to about 20 wt % should be interpreted to include not only the explicitly recited limits of 1 wt % and about 20 wt %, but also to include individual weights such as 2 wt %, 11 wt %, 14 wt %, and sub-ranges such as 10 wt % to 20 wt %, 5 wt % to 15 wt %, etc.

The following illustrates an example of the disclosure. However, it is to be understood that this example is merely exemplary or illustrative of the application of the principles of the present disclosure. Numerous modifications and alternative compositions, methods, and systems may be devised by those skilled in the art without departing from the spirit and scope of the present disclosure. The appended claims are intended to cover such modifications and arrangements.

What is claimed is:

1. A microfluidic device, comprising:
   a substrate;
   a lid mounted to the substrate and forming a discrete microfluidic chamber between structures including an interior surface of the lid and a portion of the substrate, said lid comprising an inlet and a vent positioned relative to one another to facilitate loading of fluid to the discrete microfluidic chamber via capillary action; and
   a microchip mounted to the substrate, a portion of the microchip positioned within the discrete microfluidic chamber and a second portion of the microchip positioned outside of the discrete microfluidic chamber;
   wherein the lid further comprises an exterior surface modification selected from of a Fresnel lens, a crenulated surface, a non-uniform thickness, a thin film optical filter, or a combination thereof; the lid comprises an interior modification to enhance surface wetting; or the microchip comprises an exterior modification; or a combination thereof.

2. The microfluidic device of claim 1, wherein the substrate comprises a material selected from a metal, glass, silicon, silicon dioxide, a ceramic material, a polymer material, or a combination thereof.

3. The microfluidic device of claim 1, wherein the lid comprises a material selected from glass, quartz, polymer, amorphous polymer, or a combination thereof.

4. The microfluidic device of claim 1, wherein the lid forms multiple discrete microfluidic chambers between structures including portions of the interior surface of the lid and corresponding portions of the substrate.

5. The microfluidic device of claim 1, further comprising a second lid, wherein the second lid forms a second discrete microfluidic chamber between structures including an interior surface of the second lid and a second portion of the substrate, said second lid comprising a second inlet and a second vent positioned relative to one another to facilitate loading of fluid to the second discrete microfluidic chamber via capillary action.

6. The microfluidic device of claim 5, wherein a second portion of the microchip is positioned within the second discrete microfluidic chamber.

7. The microfluidic device of claim 1, wherein the discrete microfluidic chamber has a volume of from 1 nl to 100 μl.

8. The microfluidic device of claim 1, wherein the lid has a height of from 0.2 mm to 5 mm, a width of from 0.4 to 50 mm, a length of from 0.1 mm to 60 mm, and a thickness of from 0.1 mm to 60 mm.

9. A microfluidic device, comprising:
   a substrate;
   a lid mounted to the substrate and forming a discrete microfluidic chamber between structures including an interior surface of the lid and a portion of the substrate, said lid comprising an inlet and a vent positioned relative to one another to facilitate loading of a fluid to the discrete microfluidic chamber via capillary action; and
   an elongated microchip mounted to the substrate, a portion of the elongated microchip positioned within the discrete microfluidic chamber and a second portion of the elongated microchip positioned outside of the discrete microfluidic chamber, wherein the elongated microchip has a width to length aspect ratio from 1:10 to 1:150;
   wherein the lid further comprises an exterior surface modification selected from a Fresnel lens, a crenulated surface, a non-uniform thickness, a thin film optical filter, and a combination thereof.

10. The microfluidic device of claim 9, wherein the lid further comprises an interior surface modification to enhance surface wetting, wherein the surface modification is a surface coating, a surface treatment, or a combination thereof.

11. The microfluidic device of claim 9, wherein the elongated microchip further comprises a functional component selected from a temperature regulator, a sensor, an electromagnetic radiation source, a fluid actuator, a mixer, a bubbler, a fluid pump, or a combination thereof.

12. A microfluidic device, comprising:
a substrate;
a lid mounted to the substrate and forming a discrete microfluidic chamber between structures including an interior surface of the lid and a portion of the substrate, said lid comprising an inlet and a vent positioned relative to one another to facilitate loading of fluid to the discrete microfluidic chamber via capillary action, wherein the discrete microfluidic chamber has a volume of from 1 nl to 100 µl; and
a microchip mounted to the substrate, a portion of the microchip positioned within the discrete microfluidic chamber and a second portion of the microchip positioned outside of the discrete microfluidic chamber;
wherein the lid further comprises an exterior surface modification selected from a Fresnel lens, a crenulated surface, a non-uniform thickness, a thin film optical filter, and a combination thereof.

13. The microfluidic device of claim 12, wherein the lid has a height of from 0.2 mm to 5 mm, a width of from 0.4 to 50 mm, a length of from 0.1 mm to 60 mm, and a thickness of from 0.1 mm to 60 mm.

\* \* \* \* \*